United States Patent [19]

Berger et al.

[11] Patent Number: 4,477,185
[45] Date of Patent: Oct. 16, 1984

[54] OPTICAL IMAGING APPARATUS

[75] Inventors: Laurent Berger; Paul Tigreat, both of Meylan, France

[73] Assignee: Euromask, Paris, France

[21] Appl. No.: 369,117

[22] Filed: Apr. 16, 1982

[30] Foreign Application Priority Data

Apr. 16, 1981 [FR] France .................................. 81 07709

[51] Int. Cl.³ .......................... G01B 11/26; G01C 3/10; G06K 7/15; G06K 15/00
[52] U.S. Cl. .................................... 356/152; 250/557; 250/561; 356/1; 356/381; 356/400
[58] Field of Search ..................... 250/557, 561; 356/1, 356/141, 400, 381, 152

[56] References Cited

U.S. PATENT DOCUMENTS

| | | | |
|---|---|---|---|
| 3,612,698 | 10/1971 | Mathisen | 356/152 |
| 3,645,623 | 2/1972 | Patten | 356/381 |
| 3,775,011 | 11/1973 | Marsh | 356/400 |
| 3,865,483 | 2/1975 | Wojcik | 356/152 |
| 4,090,068 | 5/1978 | Widmann et al. | 356/152 |

OTHER PUBLICATIONS

Rhodes, K. E., "Semiconductor Chip Leveling Apparatus", IBM Tech. Disclosure Bulletin, vol. 21, No. 10, 3/79-pp. 4121-4122.
"Step-and-Repeat Wafer Imaging", by S. Wittekoek, Solid State Technology, vol. 23, Jun. 1980, pp. 80-84.

Primary Examiner—S. C. Buczinski
Attorney, Agent, or Firm—Fleit, Jacobson, Cohn & Price

[57] ABSTRACT

An imaging apparatus, for instance a wafer stepper, has an optical system for forming an image of an object such as a reticle and it has a focusing device. The focusing device has detector means for determining deviations between the actual image surface of the optical system and a second surface (surface of the semiconductor wafer) on which the image is to be formed. The focusing device includes two sets of detector means, each said set having means fast with the optical system and constructed to focus a spot of monochromatic light under a large angle of incidence onto said actual image surface and means for collecting the light reflected by said second surface and focusing it on a differential light detector so located that the image of the spot is centered on the detector when the two surfaces coincide and means for summing differential signals supplied by the detectors of both sets, said sets being arranged for the light path in the two sets of detector means to be substantially reverse from each other.

6 Claims, 9 Drawing Figures

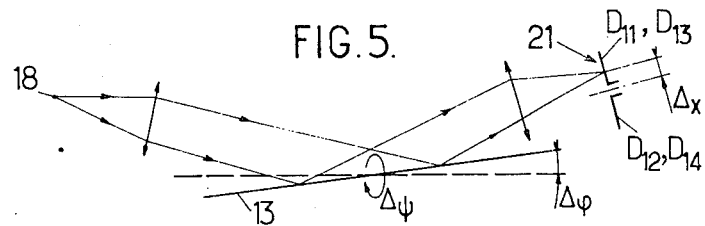
FIG.5.
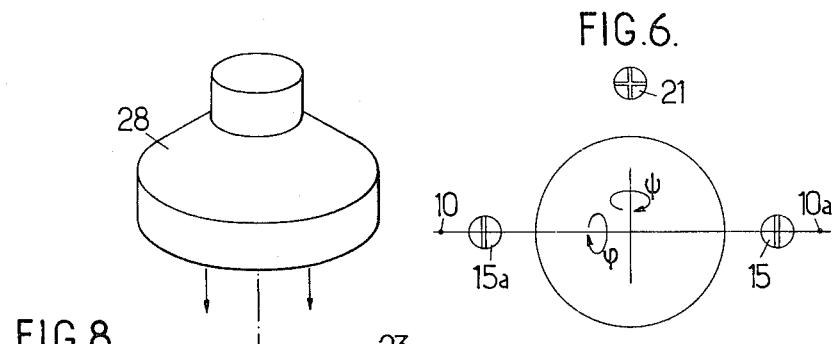
FIG.6.
FIG.8.
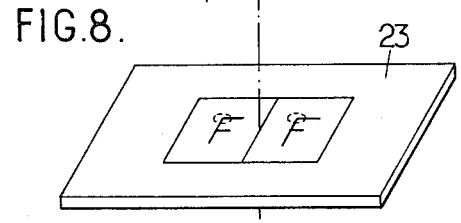
FIG.7.
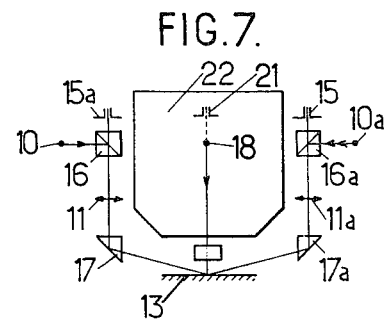
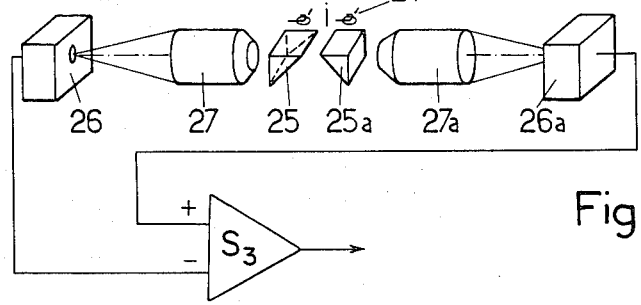
Fig.7A.
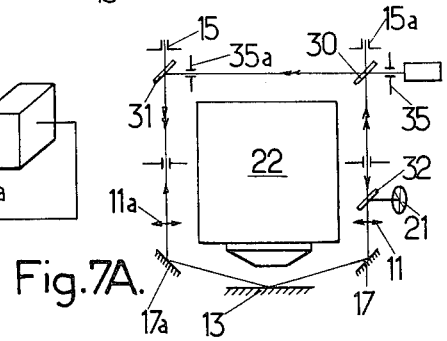

OPTICAL IMAGING APPARATUS

BACKGROUND AND SUMMARY OF THE INVENTION

The present invention relates to an imaging apparatus having an optical system for forming an image of an object, of the type having a focusing device provided with detector means for determining deviations between the actual image surface, which has a predetermined position with respect to the optical system, and a second surface on which the image of the object is to be formed. Such apparatuses are known in which the focusing device has means fast with the optical system and constructed to focus a spot of monochromatic light under a large angle of incidence onto said actual image surface and means for collecting the light reflected by said second surface and focusing it on a differential light detector which is so located that the image of the spot on the detector is centered on the detector when the two surfaces coincide.

The invention is particularly suitable for use in equipment used for manufacturing integrated circuits, and notably in the equipment known as "step and repeat device" or wafer stepper, designed to form repetitively the image of a reticle on successive areas of the surface of a semiconductor wafer, then, the surface of the wafer constitutes the second surface.

The distance between the lens system of the photorepeater, and the surface should be accurately adjusted for fear of degradation of the image. By way of example, the distance between the lens and the surface is 6 mm in a current commercial step and repeat apparatus and the tolerance is then 2 microns to project a mask pattern having 1 micron wide lines.

Imaging apparatuses suitable for use as photorepeater have been used which include focusing devices operating automatically. Such devices exist in wafer steppers manufactured by G.C.A. since 1977 at least. The construction and operation of the detector means are illustrated in FIGS. 1 and 2. A monochromatic light source 10 is associated with lens 11 which forms an image 12 of the source which is on the surface of the wafer 13 when the latter is in its set position, as indicated in FIG. 1. Light collecting means, shown diagrammatically in the form of a lens 14, form an image of the light spot on the surface 13 which, when the wafer 13 is in its nominal position, is centered with respect to a differential optoelectronic detector 15; that detector may for instance have a two-quadrant diode, or two separate diodes. A differential error or deviation signal is obtained which is fed to a servo system.

Referring to FIG. 2, any deviation in the altitude $\Delta z$ of the wafer 13 causes an offset $\Delta x$ of the image in the differential photodetector 15, hence an error signal whose value is an increasing function of $\Delta x$ and whose sign depends on the direction of $\Delta z$.

Such an autofocus device can be very sensitive, particularly if the light beam has a large angle of incidence. However, it has a serious drawback. Any irregularity in reflection by the surface of the wafer 13 results in an asymmetry in the brightness distribution of the spot and can result in a focusing error.

Attempts have been made to overcome the difficulty by making the light follow the same path in one direction, and then the opposite direction by replacing detector 15 with a mirror reflecting it to a detector positioned close to the source 10 (Solid State Technology, June 1980). This solution is not however entirely satisfactory due to associated construction problems.

It is an object of the invention to provide an improved imaging apparatus of the above-defined type. It is a more particular object to provide an imaging apparatus having an automatic focusing device overcoming the problems associated with reflection defects of the surface on which the image should be formed and however simple.

An apparatus according to the invention has two sets of said detector means, corresponding to reverse paths of the light and means are provided for summing the differential signals supplied by the detectors of the two sets.

For the two paths to coincide, it will typically be necessary to provide beam splitters, such as semitransparent strips, for reflecting light from the light source of one of the sets while transmitting light to the detector of the other set.

The device preferably further comprises detector means constructed and associated for sensing angular deviations, that is to say attitude deviations, between the second surface and an ideal angular position. The additional means may include a source to direct an oblique parallel beam of light onto the surface and means for focusing the image of the source onto a four quadrant photodetector; processing of the output signals from the four quadrants makes it possible to deliver attitude error signals indicating angular deviations about two mutually perpendicular axes.

It is another object of the invention to overcome a difficulty which is specific to wafer steppers. When a reticle or mask is handled to print images thereof in several successive zones on a semiconductor wafer, care should be taken to avoid depositing particles on the reticle whose image would be reproduced in the integrated circuit. At the present time, equipment for reticle inspection by photometric comparison of two homologous areas of adjacent patterns is known. However, that approach has drawbacks. It is in fact the reticle that is checked, rather than the image thereof in the plane of the wafer. Moreover, there remains a risk that dust is deposited during the transfer from the checking apparatus to the wafer stepper.

For overcoming the difficulty, the wafer stepper has means for forming two homologous areas of adjacent patterns on two photoelectric detectors and for measuring the difference between the output signals from the two detectors.

The approach can be used each time several elementary patterns of integrated circuit exist on the same reticle, which is frequently the case since the time duration of the step and repeat operation on the wafer is thus reduced. The actual image and not the reticle is examined directly, whereby defects printed on the silicon wafer are taken into account as well and reticles are found acceptable which would be rejected in a conventional inspection apparatus. The defect detection resolution is of the same order of magnitude as the resolution of the lens, that is equal or even less than one micron.

The various components of the device may be varied in position with respect to those which serve directly for imaging. For example, the angular deviation detection means (levelling means) may use a light path in a plane forming an angle, for example a right angle, with the plane of the light paths in the sets of means for autofocusing.

The invention will be better understood from the following description of particular embodiments of the invention, given by way of examples.

SHORT DESCRIPTION OF THE DRAWINGS

FIGS. 4 and 5 are schemtic diagrams, similar to FIGS. 1 and 2, showing means which can be associated with those of FIG. 3 for detection of angular deviations (attitude deviations);

FIG. 6 is a diagram showing the distribution and constitution of the photodetectors of detector means for sensing deviations in altitude and in attitude, as seen from above;

FIG. 7 is a diagram illustrating the location of the detector means in a wafer stepper;

FIG. 7A illustrates a modification of FIG. 7;

FIG. 8 is an isometric view showing the arrangement of reticle inspection means for a wafer stepper, in diagrammatic form.

DETAILED DESCRIPTION OF PREFERRED EMBODIMENTS

Figure 3:
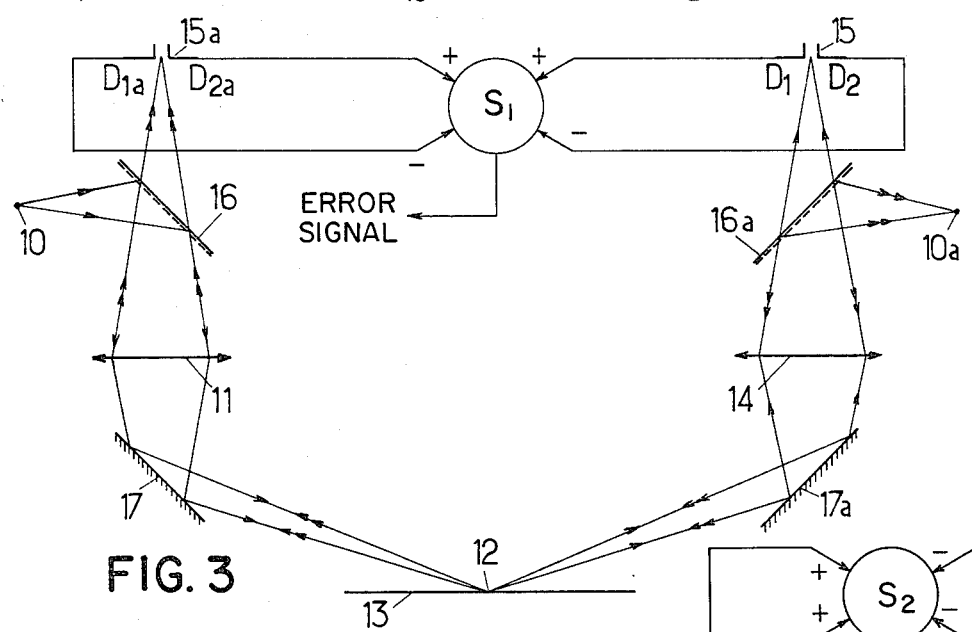
FIG. 3 is a schematic diagram, similar to that of FIG. 1, showing the detection means of an apparatus according to a first embodiment of the invention, in which only deviations in altitude or height are detected.

Referring to FIG. 3, detector means for sensing deviations in height between the surface 13, constituted by a silicon wafer possibly having irregularities and/or lack of planeity, and a reference will be described.

Figure 1:
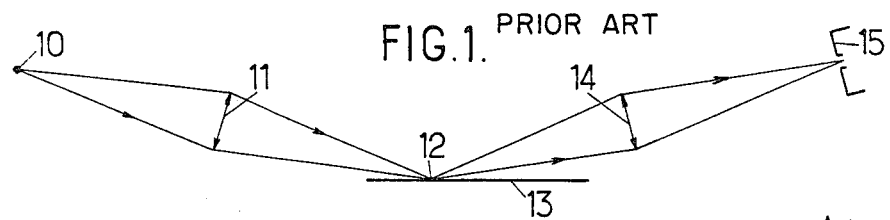
FIGS. 1 and 2 are schematic diagrams showing deviation detection means according to the prior art, respectively when the image surface is in its set position and when it is offset therefrom.
Figure 2:
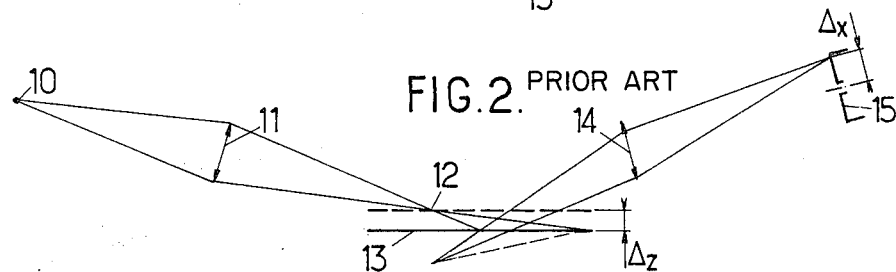

The detection means are symmetrical and may be regarded as including two sets of identical means. The first set (in which elements corresponding to those of FIG. 1 are denoted by the same reference numeral) comprises a monochromatic light source 10 whose output beam strikes a beam splitter, such as a semi-transparent strip 16, whose role will later appear.

The beam reflected by strip 16 is focused by a lens 11 and a reflecting mirror 17 into a spot 12 which is on the surface of the wafer 13 when the latter occupies an ideal position (i.e. coincides with the actual image plane). A mirror 17a symmetric with mirror 17 and a lens 14 symmetric with lens 11 form an image of spot 12 on to differential light detector means 15 through another semi-transparent strip 16a. Symmetrically, a system including the semi-transparent strip 16a, the lens 14 and the mirror 17a forms an image of the source 10a coextensive with spot 12. The light reflected by the surface 13 is collected by the mirror 17, the lens 11 and the semi-transparent strip 16 to form an image on light detector means 15a similar to detector 15.

If it is assumed that the photodetectors 15 and 15a each includes two quadrants, respectively D1 and D2, D1a and D2a, the detectors may be associated in a summing circuit S1 which will deliver an error signal:

$$(D1-D2)+(D2a-D1a)$$

The detectors will be placed and adjusted so that the output signal, which may be obtained by a conventional analog summing circuit, is zero when the surface 13 is in the set or ideal position.

With that arrangement, the problem encountered with a single light path is eliminated; in fact, the image of an asymmetric spot on the photodetector 15 will also be asymmetric in the same way on the photodetector 15a. In addition, the sources 10 and 10a may without definite disadvantage have slightly different intensities, since the average value of the two photoelectric signals is used.

At the present time, most wafer steppers include an autofocusing device, but which only ensures correction of altitude (distance) deviations. According to an aspect of the present invention, attitude monitoring may easily be carried out; such "levelling" has an importance which was not appreciated. In fact, automatic levelling is extremely desirable, since it compensates for slow variation in the slope of the surface of silicon wafers.

Figure 4:
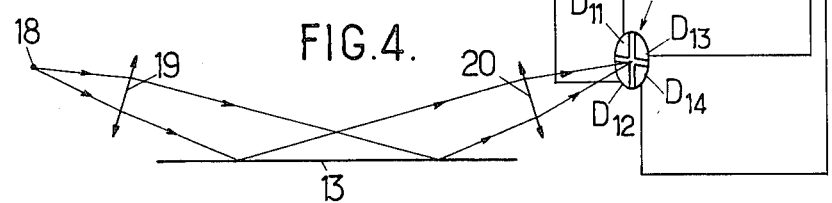

Referring to FIGS. 4 and 5, there is shown detector means which can be incorporated in an imaging apparatus to provide the necessary input signals for level adjustment to a focusing device.

The means shown in FIGS. 4 and 5 include means for directing a beam of monochromatic parallel light on to the wafer 13 at a large angle of incidence. The means comprise the source 18 and an optical system shown diagrammatically as lens 19. A second optical system, also shown diagrammatically as lens 10, images the point source 18 on to a four-quadrant optoelectronic detector 21 which may be a four-quadrant diode $D_{11}$, $D_{12}$, $D_{13}$, $D_{14}$. As shown in FIG. 5, any angular deviation $\Delta\phi$ about an axis perpendicular to the plane of the Figure results into an offset $\Delta x$ in the photodetector 21. If $D_{11}$, $D_{12}$, $D_{13}$ and $D_{14}$ are used to designate the output signals of the four quadrants, the error signal will be:

$$(D_{11}+D_{13})-(D_{12}+D_{14})$$

Similarly, any angular deviation $\Delta\Psi$ about an axis parallel to the plane of the Figure will result into an error signal:

$$(D_{11}+D_{12})-(D_{13}+D_{14}).$$

The angular deviation $\Delta\Psi$ may be provided by a summing circuit S2 as indicated in FIG. 4.

The error signals can be injected into servoloops for correcting $\phi$ and $\Psi$. The loops will not be described here, no more than the mechanical devices for resetting the wafer into correct position, since they may be of conventional type, for example as described in "The Bell System Technical Journal", November 1970, pp. 2158–2160.

It should be noted that passage of light along two opposite paths is not necessary here, since imaging onto the opto-electronic detector provides averaging of the value.

The altitude (distance) and attitude (level) deviation detection means may be distinct and distributed around the lens of the same wafer stepper, as shown in FIGS. 6 and 7; the optical paths of the altitude and attitude deviation measuring means are in planes at right angles and the paths straddle the objective lens 22. The sources 15, 15a and 18 may consist of independent emitters of sufficient brightness (a laser diode for example) or of the terminal portions of optical fibers. The reflecting mirrors 17 and 17a as well as the semi-transparent strips 16 and 16a may be constituted by prisms.

With lens 11 and 11a of focal length 50 mm and magnification ten, an error in altitude $\Delta z=2$ microns results into a movement of the spot image which is approximately 40 microns. An attitude error $\Delta\phi=5$ microns/cm will give, for a focal length of 50 mm, a movement of the spot image equal to about 50 microns. Such deviations are easily detectable with currently available optoelectronic detectors.

In the modified embodiment of FIG. 7A, where the components corresponding to those of FIG. 7 are designated by the same reference numerals, a same light source is used for focusing and levelling.

A parallel light beam from the source (for instance a He-Ne laser) is split by a semi-transparent strip 30 into a reflected beam which follows a first path and a transmitted beam. The fraction of the transmitted beam which is reflected by a second separator strip 31 follows a second path which is symmetrical from the first path when the surface 13 of the silicon wafer has a correct angular position. The point sources consist of respective diaphragms 35 and 35a whose image is formed on surface 13 by lens 11 and 11a, respectively. The two differential light detectors 15 and 15a collect light from surface 13 of the washer which is respectively passed through strips 30 and 31.

Determination of the angular position is made using part of the beam which is reflected back toward the light detector 15a. That part is diverted by reflecting it on a semitransparent separator strip 32 and sent to the light detector 21, typically a four-quadrant diode located at the focus of lens 11.

It will be appreciated that the advantage of the system of FIG. 7A is that it is much more simple than that of FIG. 7.

Referring to FIG. 8, means will be described for inspecting the image of the reticle which may be incorporated in a wafer stepper also comprising an autofocusing device of the type described hereinabove.

FIG. 8 diagrammatically illustrates the reducing objective lens 22 of the wafer stepper which forms a real image 24 of the reticle 23, once the latter is positioned in the wafer stepper. Inspection and monitoring are carried out by comparing homologous areas of two adjacent patterns: the requirement that there should be more than one pattern does not constitute a real limitation, since reasons of manufacturing speed generally lead to printing several patterns at a time. The useful field of a wafer stepper is generally of about 1 cm×1 cm and the invention will hence be useful each time that the unitary pattern has a size which does not exceed 0.5 cm.

The inspection means comprise two mirrors, or, as illustrated in FIG. 8, two reflection prisms 25 and 25a in the shape of a half cube. The two prisms reflect the images of two homologous (associated) small surfaces of the integrated circuits onto two photosensitive detectors 26 and 26a through two microscope lenses 27 and 27a. These elements as a whole can constitute a compact assembly, housed close to the silicon wafer, on a support fastened to the x-y table which carries the wafer.

When the illuminating device 28 is lighted and forms the images, shown in dashed lines at 24, the signals measured by the photodetectors 26 and 26a are different if the homologous surfaces, bounded by circles in FIG. 8, do not have the same light transmission. A difference between the signals indicates the presence of an opaque of transparent defect in one of the two images. The difference may be provided by measuring means illustrated in FIG. 8 as a differential amplifier S3 whose inputs receive the output signals from detectors 26 and 26a.

The surfaces viewed by each optoelectronic detector 26 and 26a will correspond, for example, to a rectangle of 1×5 microns or of 1×10 microns. It is thus possible to analyse the image of the reticle with a raster scan along successive strips, 5 microns or 10 microns wide. The complete comparison operation between the two circuits of 5×5 mm leads therefore to scanning 1,000 lines of 5 microns width and 5 mm length, namely a total path of the table of 5 meters. The total minitoring time will hence be only 100 seconds if movement is at an average speed of 5 cm/s. It is seen that the output of the wafer stepper is not substantially reduced due to the inspection of the reticle before exposing one or several batches of wafers.

The response of the means shown in FIG. 8 may be recorded with the associated positions in the memory of a minicomputer which provides a map of the circuit at the end of the inspection. The stored image of the circuit helps to find the fault again under a microscope and to remove it if possible (for example, if it is dust). It is not necessary to describe here means for storage, since they can be conventional in nature.

We claim:

1. An imaging apparatus comprising: an optical system for forming an image of an object, a focusing device, said focusing device provided with detector means for determining deviations between an actual image surface of the optical system, said actual image surface having a predetermined position with respect to said optical system, and a second surface for forming the image of the object, wherein said focusing device includes two sets of detector means, each said set having means for focussing a spot of monochromatic light under a large angle of incidence onto said actual image surface, a differential light detector, means for collecting the light reflected by said second surface and focusing the reflected light on the differential light detector positioned so that the image of the spot is centered on the differential light detector when the actual surface and the second surface coincide and means for summing differential signals supplied by the differential light detectors of both sets, said sets being arranged for the light in one of the two sets of detector means to follow a path colinear with and in an opposite direction to the light path of the other of said two sets.

2. Apparatus according to claim 1, wherein said sets of detector means have a plurality of semitransparent strips located on the light path each for reflecting part of the light coming from the source of one of said sets and for transmitting part of the light toward the light detector of the other set.

3. Apparatus according to claim 1, further comprising means for detecting angular deviations between said second surface and an ideal angular position, said means having light source means for directing a parallel light beam toward said second surface under a large angle of incidence, means for focusing the light reflected by said second surface on a four-quadrant detector and means for determining signals representative of the deviations about two orthogonal axes from the output signals of said detector.

4. Apparatus according to claim 3, wherein the light beam of said means for detecting angular deviations are located in a plane at an angle with the light path in said sets of detector means.

5. Apparatus according to claim 1 or 3, wherein said object is a reticle, said second surface is the surface of a semiconductor wafer, said optical system comprises objective lenses located between said reticle and wafer and wherein said detector means are located to straddle said objective lens.

6. Apparatus according to claim 5, comprising means for forming images of two corresponding zones of adjacent patterns of said reticle on two photoelectrical detectors and means for measuring the difference between the output signals of said two detectors.

* * * * *